United States Patent [19]
Yang et al.

[11] Patent Number: 6,048,743
[45] Date of Patent: *Apr. 11, 2000

[54] USING A SUBMICRON LEVEL DIMENSION REFERENCE

[75] Inventors: Kyoung-mo Yang; Sang-kil Lee, both of Suwon, Rep. of Korea

[73] Assignee: Samsung Electronics Co., Ltd., Suwon, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/906,880

[22] Filed: Aug. 6, 1997

[30]     Foreign Application Priority Data

Aug. 9, 1996 [KR]  Rep. of Korea ....................... 96-33274

[51] Int. Cl.$^7$ ....................................................... H03L 23/58
[52] U.S. Cl. ................................. 438/14; 438/18; 257/48; 702/97; 250/252.1
[58] Field of Search ..................................... 438/592, 593, 438/618, 622, 14, 17, 18; 257/48, 758, 756, 760, 797; 29/25.01; 250/252.1, 339.09, 341.5; 702/97

[56]     References Cited

U.S. PATENT DOCUMENTS

| | | |
|---|---|---|
| 3,921,282 | 11/1975 | Cunningham et al. ................. 257/754 |
| 4,818,873 | 4/1989 | Herriot .................................. 250/252.1 |
| 4,885,472 | 12/1989 | Young ................................... 250/252.1 |
| 4,943,148 | 7/1990 | Mondragon et al. ................. 250/252.1 |
| 5,023,701 | 6/1991 | Sharpe-Geisler ....................... 257/776 |
| 5,336,895 | 8/1994 | Nakano ................................. 250/252.1 |
| 5,409,860 | 4/1995 | Jeon ....................................... 438/586 |
| 5,675,185 | 10/1997 | Chen et al. ............................. 257/774 |
| 5,763,894 | 6/1998 | Enichen et al. ...................... 250/252.1 |

*Primary Examiner*—Donald L. Monin, Jr.
*Assistant Examiner*—Michael Dietrich
*Attorney, Agent, or Firm*—Jones Volentine, L.L.P.

[57]     ABSTRACT

A submicron level dimension reference for use with a scanning electron microscope in a semiconductor device fabrication apparatus. The reference has a first insulating layer with a first pattern formed on a semiconductor wafer substrate. A plurality of contacts are formed between the first pattern of the first insulating layer such that the contacts directly communicate the wafer substrate. The contacts are capable of carrying an electrical charge. An electrically conductive layer is formed over the contacts and the first insulating layer. A second insulating layer with a second pattern is formed over the conductive layer. Electrical charges generated by radiating the scanning electron microscope on the submicron level dimension reference are transferred from the first and second insulating layers to the wafer substrate via the conductive layer and the plurality of contacts.

6 Claims, 3 Drawing Sheets

USING A SUBMICRON LEVEL DIMENSION REFERENCE

BACKGROUND OF THE INVENTION

1. Field of the Invention

The present invention relates to a submicron level dimension reference for controlling the precision of a scanning electron microscope (SEM) which is employed for the purpose of controlling the critical dimensions (CD) in manufacturing a semiconductor device. More specifically, the submicron level dimension reference prevents an electrification or charging problem while using the SEM in manufacturing the semiconductor device.

2. Discussion of Related Art

When manufacturing semiconductor devices, a scanning electron microscope (SEM) is generally used for measuring critical dimensions (CD) of the semiconductor device. Generally, a SEM measures the sizes of microscopic objects. Accordingly, the precision of the SEM is very important and must be adjusted periodically to be kept at a proper level.

When a reference whose size and pattern are already known is measured with the SEM, the measured value is compared with the known value. If the two values are different, the SEM should be adjusted to make them identical through the fine manipulation of the SEM. The known reference, used as a basis for adjusting the SEM, is a submicron level dimension reference, of which there are three conventional types.

The first type of a submicron level dimension reference 10 is a poly pattern type shown in FIG. 1. In this type, silicon dioxide 12 is deposited on a silicon substrate 11 so that the adhesion between a polysilicon 13, which is deposited on the silicon dioxide layer 12, and the silicon substrate 11 is increased. The polysilicon 13 is deposited over the silicon dioxide 12 and forms a pattern.

The second type of submicron level dimension reference 20 is a silicon dioxide pattern type shown in FIG. 2. In this type, silicon dioxide 22 is deposited on a silicon substrate 21 so that the adhesion between the silicon substrate 21 and a conductive layer 23 (e.g., polysilicon) deposited on the silicon dioxide 22 is increased. Another silicon dioxide layer 24 is formed on the conductive layer 23 and forms a pattern.

The third type of submicron level dimension reference 30 is a standard micro scale type shown in FIG. 3. In this type, a pattern is formed on the silicon substrate 31 itself. Its width and length are 1 cm, respectively. This reference type is manufactured by HITACHI of Japan and approved by the Japan Quality Assurance Organization.

These submicron level dimension references must meet several requirements before being used for adjusting the SEM.

First, the pitch or the size of reference pattern must be confirmed by a precise measuring apparatus, other than the specific SEM which will be adjusted by the particular reference.

Second, when the reference is measured in an electron beam metrology system, such as that of a SEM, a secondary electron signal must be generated with high contrast. In other words, the size or reference pattern must be detected precisely and the pattern itself must be formed precisely.

Finally, the reference must be stable and be free of charging (electrification) as it will be used for long periods of time in the presence of an electron beam.

The conventional submicron level dimension references have some problems in meeting these criteria.

In the cases of the poly pattern 10 (FIG. 1) and silicon dioxide pattern 20 types (FIG. 2), the reference becomes overcharged due to the electrons accumulated during the operation of the SEM. These accumulated electrons on the reference change the paths of the electrons projected from the SEM, which changes the size and pattern values of an object that is measured by the equipment (SEM), making it difficult to control the equipment precisely. Specifically, the nonconductor silicon dioxide between the silicon substrate and the conductor polysilicon does not allow the charge accumulated on the surface of the polysilicon to flow toward the substrate, so that the measured value of the CD using the reference is different from the known value.

This shortcoming is illustrated in FIG. 4, which is a SEM display of a submicron level dimension reference of the silicon dioxide pattern type 20 as in FIG. 2. This display shows a view of the reference 20 and the measured SEM pattern 29. The SEM measured pattern 29 resulted from scanning the surface area designated "1" at high power for 60 seconds, followed by scanning surface areas "1" and "2" at low power.

In this scanning process, electrons projected from the SEM are accumulated and charged on the previously measured narrow area "1". Although the actual area of "1" and "2" together is flat and they are composed of the same material, the previously measured narrow area "1" appears much darker than area "2" as shown in FIG. 4. Moreover, in the SEM pattern 29, this narrow area "1" also appears lower than the surrounding area "2". This display clearly shows the distortion of the reference's pattern caused by the charging effect.

There is no charging problem in the standard micro scale type 30 of FIG. 3, but the pattern is too simple to accurately perceive the variation of the SEM as it is measuring the CD.

For example, when using references 10 and 20, if the setting of the SEM is changed slightly, you are made aware that the SEM must be adjusted because the depth of focus is obscured in the SEM. However, if you use the standard micro scale type 30, you are not made aware of the necessity to adjust the SEM because the simplicity of the pattern does not provide sufficient pattern contrast in the SEM display.

As a result of these shortcomings, SEM measurements are not performed in an optimal manner, leading to imprecise measured values that are different than the known values.

Another disadvantage of these conventional references is that it is difficult to install them directly in the SEM because the shape of the reference is not the same as the wafer used in the semiconductor device manufacturing process. The reference may also be contaminated easily while an operator manually adjusts the equipment to suitably receive the reference. Another disadvantage is that the reference may not be used for long periods because of contaminants from the surroundings.

SUMMARY OF THE INVENTION

Accordingly, the present invention is directed to a submicron level dimension reference that substantially overcomes one or more of the problems due to the limitations and disadvantages of the related art.

The present invention provides a submicron level dimension reference for adjusting the scanning electron microscope (SEM) to a greater degree in order to precisely measure the CD of semiconductor devices being manufactured.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a submicron level dimension reference for use with a scanning electron microscope in a semiconductor device fabrication apparatus, comprising: a first insulating layer having a first pattern formed on a semiconductor wafer substrate; a plurality of contacts formed between the first pattern of the first insulating layer such that the contacts directly communicate with the wafer substrate, the contacts being capable of carrying an electrical charge therethrough; an electrically conductive layer formed over the contacts and the first insulating layer; and a second insulating layer having a second pattern formed over the conductive layer, wherein electrical charges, generated by radiating the scanning electron microscope on the submicron level dimension reference, are transferred from the first and second insulating layers to the wafer substrate via the conductive layer and the plurality of contacts.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings illustrate an embodiment of the invention and together with the description serve to explain the principles of the invention, where:

DETAILED DESCRIPTION OF PREFERRED EMBODIMENT

Figure 5:
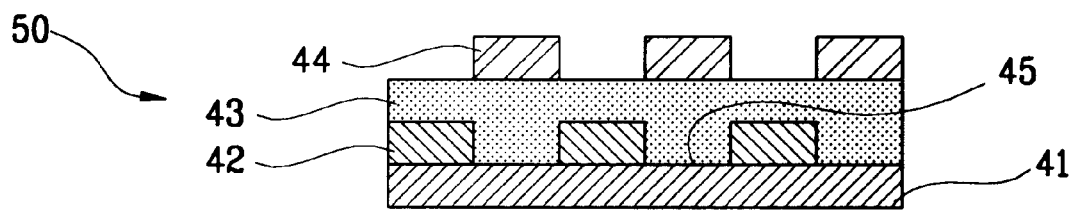
FIG. 5 is a cross-sectional view showing a submicron level dimension reference according to an embodiment of the present invention.

Reference will now be made in detail to the preferred embodiment of the present invention as shown in FIG. 5.

The submicron level dimension reference 50 is manufactured through the following steps. A first insulating layer 42 is formed on a silicon wafer substrate 41. In FIG. 5, note that the first insulating layer 42 forms a first pattern over the wafer substrate 41.

Next, a plurality of contacts 45 are formed between the first pattern of the insulating layer 42 so that the contacts 45 may directly communicate with the wafer substrate 41. The contacts 45 are capable of carrying an electrical charge therethrough.

An electrically conductive layer 43 is then formed over the contacts 45 and the first insulating layer layer 42. Finally, a second insulating layer 44 is formed over the conductive layer 43, with the second insulating layer 44 forming a second pattern. Preferably, as shown in FIG. 5, the second pattern of the second insulating layer 44 is vertically formed over the plurality of contacts 45, although it need not be. In addition, the second pattern is preferably kept at a proper height in order to provide sufficient contrast to make adjusting the SEM easier and more accurate.

The first and second insulating layers 42 and 44 may be made of silicon dioxide and the conductive layer 43 may be made of polysilicon, for example. The conductive layer 43 preferably has a thickness of 1000 Å to 2000 Å, although other thicknesses are contemplated within the scope of the present invention.

Since the submicron level dimension reference 50 made through above steps is formed on the wafer, there is no need for an operator to manually adjust the equipment to suitably receive the reference as in the standard micro scale type 30. Therefore, the reference 50 can be used conveniently and for long periods of time because there is less environmental contamination. Also, the structure of the present invention still provides sufficient adhesion between the silicon substrate 41 and the conductive layer 43.

Since the electrons projected from the SEM do not accumulate in the nonconductive silicon dioxide layer 42, but rather are discharged through the conductive contacts 45, the distortion of the SEM display pattern due to charging or electrification can be prevented.

Figure 6:
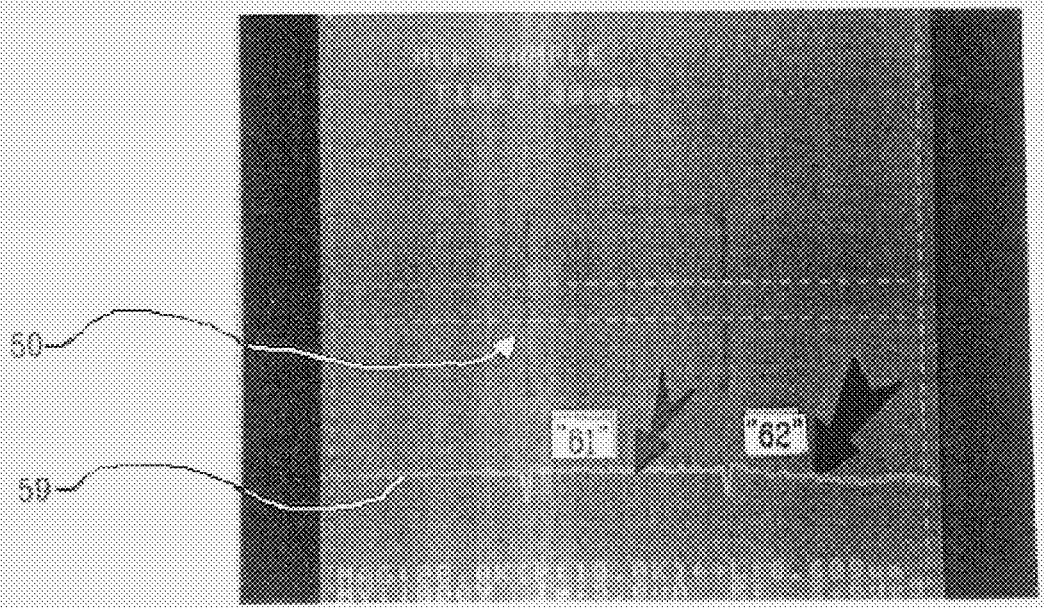
FIG. 6 is a SEM display of the submicron level dimension reference of FIG. 5.

FIG. 6 is a SEM display of the submicron level dimension reference 50 as in FIG. 5. This display shows a view of the reference 50 and the resulting measured SEM pattern 59. The areas "61" and "62" together are flat and they are composed of the same material. The SEM measured pattern 59 resulted from scanning the surface area designated "61" at high power for 60 seconds, followed by scanning surface areas "61" and "62" at low power.

In this scanning process, the area "61" is hardly distinguishable from the surrounding area "62", either in contrast or in the level of the SEM pattern 59. This is because the electrons projected from the SEM do not accumulate on the area "61", but rather are discharged through the conductive layer 43 and contacts 45.

Figure 4:
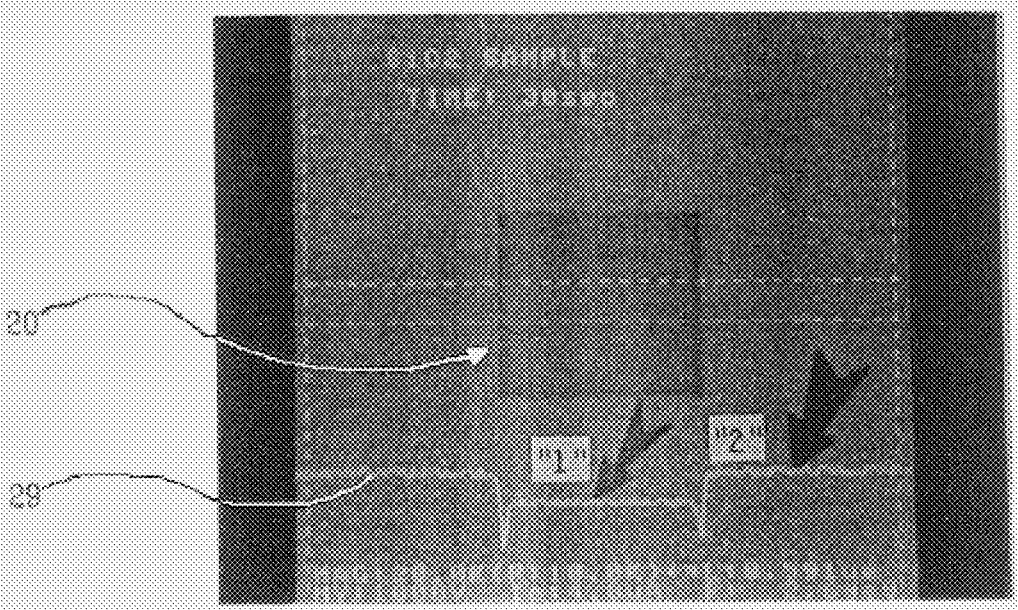
FIG. 4 is a SEM display of the submicron level dimension reference of the silicon dioxide pattern type of FIG. 2.

When compared with the scanning of the conventional reference shown in FIG. 4, the reference of the present invention as shown in FIG. 6 clearly shows that the distortion of the reference caused by charging or electrification is effectively prevented.

Figure 1:
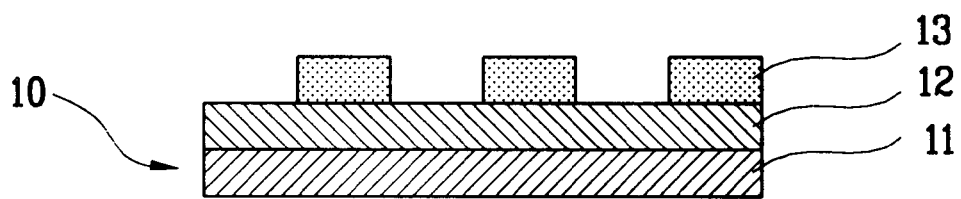
FIG. 1 is a cross-sectional view showing a conventional submicron level dimension reference of a poly pattern type.
Figure 2:
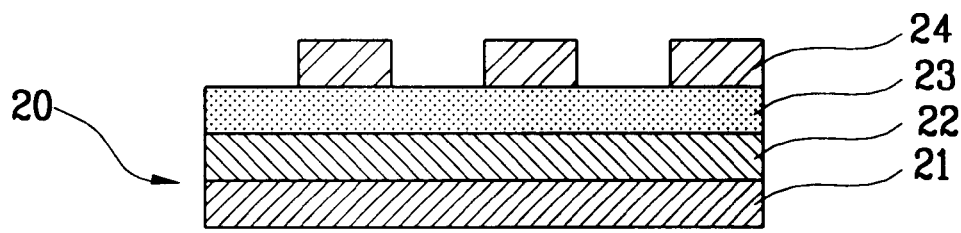
FIG. 2 is a cross-sectional view showing a conventional submicron level dimension reference of a silicon dioxide pattern type.
Figure 3:
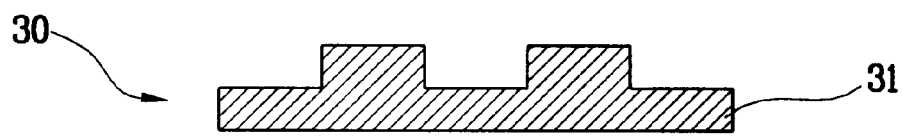
FIG. 3 is a cross-sectional view showing a conventional submicron level dimension reference of a standard micro scale type.

Table 1 below compares the pitch and bar values measured by a SEM affected by the charging of the submicron level dimension references of the poly pattern type 10 (FIG. 1) and silicon dioxide pattern type 20 (FIG. 2) according to the prior art and that of the present invention 50 (FIG. 5). Pitch refers to the size of the area, which is a unit of the repeated pattern, and bar refers to the width of the projecting part on the pattern. Each numerical value stands for the amount of charge of each 1000 Å pattern caused by the electrification.

TABLE 1

Pitch And Bar Values For Prior Art and Present Invention

| Object → Time | Pitch (Å) Reference Type of the Prior Art | | | Bar (Å) Reference Type of the Prior Art | | |
|---|---|---|---|---|---|---|
| elapsed (sec) ↓ | Poly pattern | Silicon dioxide pattern | Present invention | Poly pattern | Silicon dioxide pattern | Present invention |
| 100 | 8 | 10 | 4 | 60 | 40 | 5 |
| 200 | 5 | 11 | 4 | 70 | 40 | 8 |
| 300 | 8 | 11 | 3 | 80 | 50 | 10 |
| 400 | 15 | 11 | 2 | 90 | 50 | 10 |
| 500 | 20 | 11 | 1 | 100 | 40 | 10 |
| 600 | 22 | 12 | 1 | 110 | 30 | 10 |
| 700 | 22 | 13 | 2 | 120 | 30 | 11 |

As shown in Table 1, the clearness of the pattern decreases and the size of the bar is changed according to the elapsed charging time. The pitch and bar values using the submicron level dimension reference 50 according to the present invention are vastly improved over that of the poly pattern type 10 and silicon dioxide pattern type 20. Accordingly, the distortion caused by the charging is greatly reduced.

The present invention allows for precise adjustment of SEMs because the charging (electrification) on the surface of reference, which affects the measurement, can be effectively overcome. As a result, the semiconductor devices being manufactured have an improved quality.

It will be apparent to those skilled in the art that various modifications and variations can be made in the submicron level dimension reference of the present invention without departing from the spirit or scope of the invention. Thus, it is intended that the present invention cover the modifications and variations of this invention that come within the scope of the appended claims and their equivalents.

What is claimed is:

1. A method of calibrating a scanning electron microscope comprising:

providing a first insulating layer having a first pattern of a first predetermined dimensions formed on a semiconductor wafer substrate;

providing a plurality of contacts between said first pattern of the first insulating layer such that said contacts directly communicate with said wafer substrate, said contacts carrying electrical charge to said wafer substrate;

providing an electrically conductive layer over said contacts and said first insulating layer for transferring charge received from the scanning electron microscope;

providing a second insulating layer having a second pattern of second predetermined dimensions formed over the conductive layer;

measuring the dimensions of the first and second insulating layers using the scanning electron microscope;

comparing the dimensions measured by the scanning electron microscope to the first and second predetermined dimensions; and adjusting, when the comparing indicates the measured dimensions and the first and second predetermined dimensions are different, the scanning electron microscope in accordance with the comparing.

2. The method of claim 1, wherein said providing said second pattern includes vertically forming said second pattern over said plurality of contacts.

3. The method of claim 1, wherein the first and second insulating layers are made from silicon dioxide.

4. The method of claim 1, wherein the conductive layer is made from polysilicon.

5. The method of claim 1, wherein the conductive layer has a thickness of 1000 Å to 2000 Å.

6. The method of claim 1, wherein said providing of said second pattern includes spacing said second pattern sufficiently from the first pattern such that the second pattern provides sufficient contrast to the first pattern during said measuring.

* * * * *